United States Patent
Tezuka

(10) Patent No.: US 10,560,088 B1
(45) Date of Patent: Feb. 11, 2020

(54) TOTEM-POLE CIRCUIT DRIVER

(71) Applicant: FUJI ELECTRIC CO., LTD., Kawasaki-shi, Kanagawa (JP)

(72) Inventor: Shinichi Tezuka, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/523,677

(22) Filed: Jul. 26, 2019

(30) Foreign Application Priority Data

Aug. 13, 2018 (JP) .................................. 2018-152167

(51) Int. Cl.
*H03K 17/16* (2006.01)
*H03K 3/356* (2006.01)
*H03K 19/20* (2006.01)

(52) U.S. Cl.
CPC ........... *H03K 17/162* (2013.01); *H03K 3/356* (2013.01); *H03K 19/20* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| 9,443,966 | B2* | 9/2016 | Yamaji | H01L 29/7395 |
| 9,502,955 | B2* | 11/2016 | Ohashi | H02M 1/08 |
| 9,979,272 | B2* | 5/2018 | Tezuka | H03K 17/687 |
| 10,340,910 | B2* | 7/2019 | Takida | H03K 5/13 |
| 2014/0217466 | A1 | 8/2014 | Yamaji | |
| 2016/0036315 | A1 | 2/2016 | Ohashi et al. | |

FOREIGN PATENT DOCUMENTS

| JP | 2005-304226 A | 10/2005 |
| JP | 6194959 B2 | 9/2017 |
| WO | 2013/069408 A1 | 5/2013 |

* cited by examiner

*Primary Examiner* — Jeffery S Zweizig
(74) *Attorney, Agent, or Firm* — Rabin & Berdo, P.C.

(57) ABSTRACT

A driver circuit for driving a totem-pole circuit including cascade-connected high-side and low-side power devices. The driver circuit includes high-side and low-side drive circuits which respectively drive the high-side and low-side power devices, a pulse generation circuit which generates set and reset signals based on a high-side input logic signal, a level shift circuit which transmits the set and reset signals to the high-side drive circuit, a high-side potential detection circuit which detects a high-side reference potential, a high-side potential determination circuit which outputs an event signal upon detecting that the high-side reference potential exceeds a reference voltage, and an on-pulse stop circuit which validates or invalidates a low-side input logic signal based on the high-side input logic signal and the event signal. When the high-side input logic signal is at a low level and upon receiving the event signal, the on-pulse stop circuit invalidates the low-side input logic signal.

4 Claims, 10 Drawing Sheets

TOTEM-POLE CIRCUIT DRIVER

CROSS-REFERENCE TO RELATED APPLICATION

This application is based upon and claims the benefit of priority of the prior Japanese Patent Application No. 2018-152167, filed on Aug. 13, 2018, the entire contents of which are incorporated herein by reference.

BACKGROUND OF THE INVENTION

1. Field of the Invention

The embodiment discussed herein is related to a totem-pole circuit driver for driving a totem-pole circuit including two power devices cascade-connected.

2. Background of the Related Art

With switching power supply apparatus the following circuit structure is adopted. A totem-pole circuit having two power devices cascade-connected is included. A high-side power device and a low-side power device of the totem-pole circuit are driven by drive circuits which are independent of each other. A high voltage integrated circuit (HVIC) is known as an apparatus having such a circuit structure.

An HVIC includes a pulse generation circuit which generates a signal used for turning on or off the high-side power device, a level shift circuit, and a high-side drive circuit which drives the high-side power device by the signal transmitted via the level shift circuit. Furthermore, the HVIC includes a low-side drive circuit which drives the low-side power device. The level shift circuit level-shifts the signal generated by the pulse generation circuit with a ground potential as reference and transmits it to the high-side drive circuit located on the high side. A signal whose amplitude changes between the ground potential and the high-side power source potential of the HVIC according to a change in input signal is generated by the level shift circuit. The high-side drive circuit accepts a voltage having such an amplitude and on-off drives the high-side power device.

On the other hand, a signal for turning on or off the low-side power device is generated with the ground potential as reference. Therefore, the signal is inputted directly to the low-side drive circuit without being level-shifted.

An output terminal of the totem-pole circuit, that is to say, the connection point of the low-side power device and the high-side power device is connected to a load. As a result, external noise caused by the load and a parasitic inductance may be superimposed at the output terminal of the totem-pole circuit. At this time a potential at the output terminal of the totem-pole circuit goes into an overshooting state or an undershooting state. That is to say, a potential at the output terminal of the totem-pole circuit becomes higher than or equal to a high-voltage potential of the high-side power device or becomes lower than or equal to the ground potential.

When a potential at the output terminal of the totem-pole circuit becomes lower than the ground potential, a signal may be outputted from the pulse generation circuit. In that case, the level shift circuit does not normally transmit the signal to the high-side drive circuit. As a result, the high-side power device does not turn off at the timing at which it needs to turn off, and remains on. Alternatively, the high-side power device does not turn on at the timing at which it needs to turn on, and remains off. That is to say, the original switching function is not maintained. In particular, when the high-side power device and the low-side power device turn on at the same time due to a failure of the switching function, a through current flows.

A technique for reliably avoiding malfunction of a level shift circuit caused by a signal for driving a high-side power device not being transmitted normally was proposed (see, for example, Japanese Patent No. 6194959). According to the technique described in Japanese Patent No. 6194959, for example, a potential at an output terminal of a totem-pole circuit, that is to say, a high-side reference potential on the high side is detected and whether there is a change in potential that impedes the transmission of a signal used for driving the power device is determined. If the determination that there is a change in potential which impedes the transmission of a signal used for driving the power device is made, then a pulse generation circuit is requested to generate again a signal used for driving the power device. By generating again the signal used for driving the power device, the signal is reliably transmitted to a high-side drive circuit.

Furthermore, the following technique was proposed in order to prevent a high-side power device and a low-side power device from turning on at the same time. After confirming that one of the high-side power device and the low-side power device is turned off, the other is turned on (see, for example, Japanese Laid-open Patent Publication No. 2005-304226). According to the technique disclosed in, for example, Japanese Laid-open Patent Publication No. 2005-304226, an off signal supplied to one of the high-side power device and the low-side power device is detected and the on operation of the other power device is activated. At this time an on signal of the high-side power device supplied from an upper apparatus is level-shifted after an off signal supplied to the low-side power device becomes valid. As a result, the high-side power device is put into an on state after the low-side power device is turned off. On the other hand, in order to validate an on signal of the low-side power device supplied from the upper apparatus, a signal obtained by level-shifting and delaying an off signal supplied to the high-side power device and a potential at an output terminal of a totem-pole circuit are used. That is to say, after confirming that the signal obtained by level-shifting and delaying the off signal supplied to the high-side power device or the potential at the output terminal of the totem-pole circuit becomes a low level, the low-side power device is put into an on state.

With the technique disclosed in, for example, Japanese Laid-open Patent Publication No. 2005-304226 for avoiding a through current, however, a measure for malfunction caused by external noise described in, for example, Japanese Patent No. 6194959 is not taken into consideration. Furthermore, in recent years high-frequency switching has been adopted. Therefore, with recent switching power supply apparatus there is a tendency for a dead time from the time when one of a high-side power device and a low-side power device is turned off to the time when the other power device is turned on to become shorter. If a short dead time is set, the high-side power device may be turned on because of external noise after the low-side power device is turned on. In addition, the high-side power device may remain on even after the elapse of the dead time because of the prolonged influence of external noise. In these cases, the high-side power device and the low-side power device are turned on simultaneously. That is to say, a short circuit occurs between the upper and lower arms and a through current flows through the high-side power device and the low-side power device. In order to control the low side, at that time the operation is stopped unintentionally on the basis of the detection of an overcurrent.

SUMMARY OF THE INVENTION

According to an aspect, there is provided a totem-pole circuit driver for driving a totem-pole circuit including a high-side power device and a low-side power device which are cascade-connected, including a high-side drive circuit which drives the high-side power device, a low-side drive circuit which drives the low-side power device, a pulse generation circuit which receives a high-side input logic signal that has a first edge and a second edge, and generates a set signal for turning on the high-side power device and a reset signal for turning off the high-side power device, based respectively on the first edge and the second edge, a level shift circuit which transmits the set signal and the reset signal to the high-side drive circuit, a high-side potential detection circuit which detects a high-side reference potential, a high-side potential determination circuit which compares a value of the high-side reference potential detected by the high-side potential detection circuit with a reference voltage, and outputs an event signal upon detecting that the value of the high-side reference potential exceeds the reference voltage, and an on-pulse stop circuit which receives a low-side input logic signal, and validates or invalidates the low-side input logic signal based on the high-side input logic signal and the event signal, wherein when the high-side input logic signal is at a low level, by which the high-side power device is turned off, and upon receiving the event signal, the pulse generation circuit regenerates the reset signal, and the on-pulse stop circuit invalidates the low-side input logic signal and outputs a signal at a low level, by which the low-side power device is turned off.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described in detail with reference to the accompanying drawings with a case where each of them is applied to a totem-pole circuit driver of a switching power supply apparatus as an example. Components in figures indicated by the same numerals are the same. Furthermore, in the following description the same numeral may be used for representing the name of a terminal and a voltage, a signal, or the like at the terminal.

First Embodiment

Figure 1:
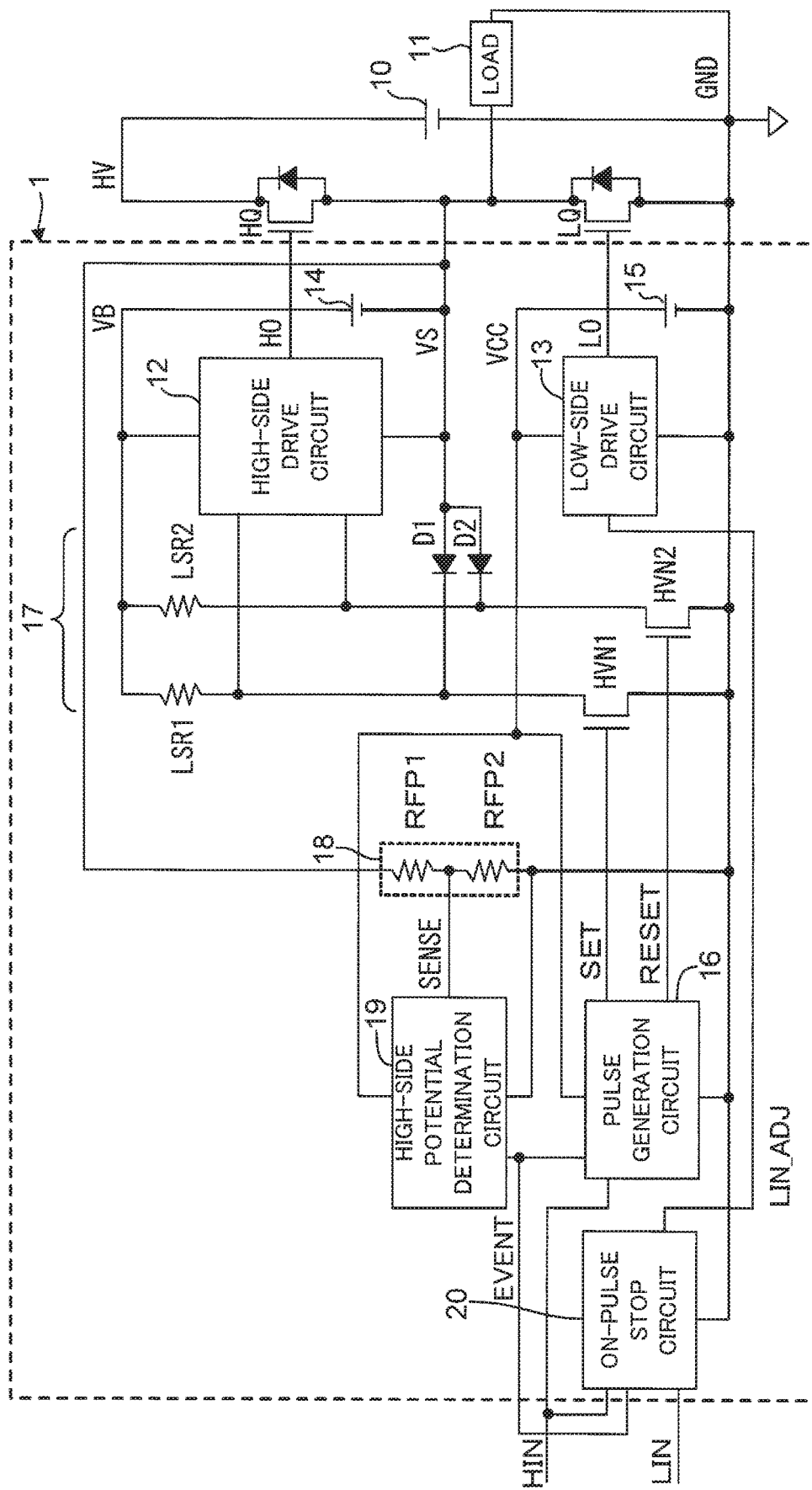
FIG. 1 is a circuit diagram illustrative of a switching power supply apparatus to which a totem-pole circuit driver according to a first embodiment is applied.
Figure 2:
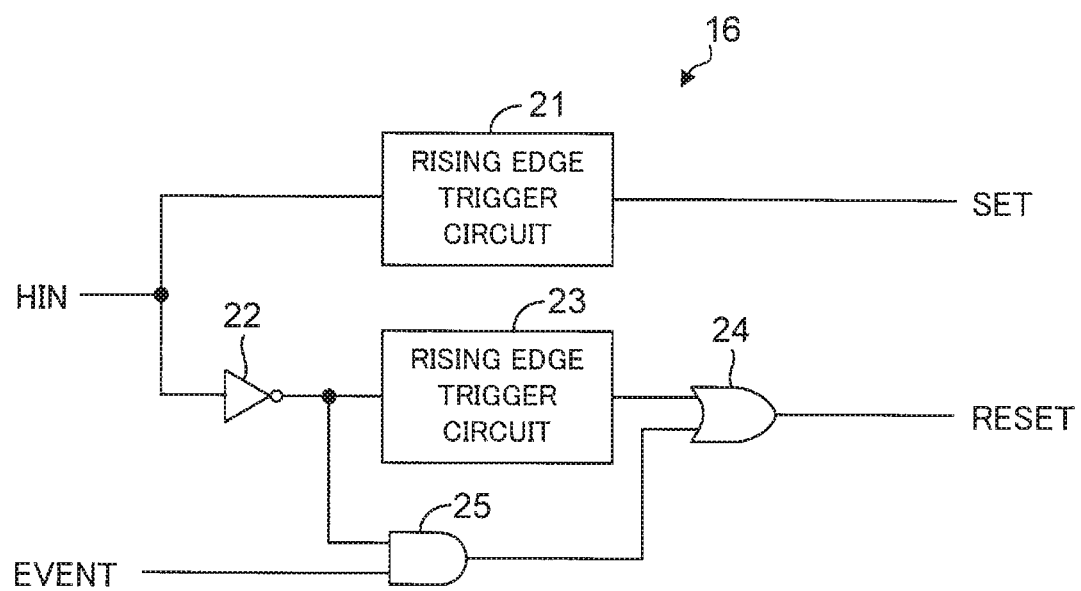
FIG. 2 is a circuit diagram illustrative of an example of a pulse generation circuit.
Figure 3:
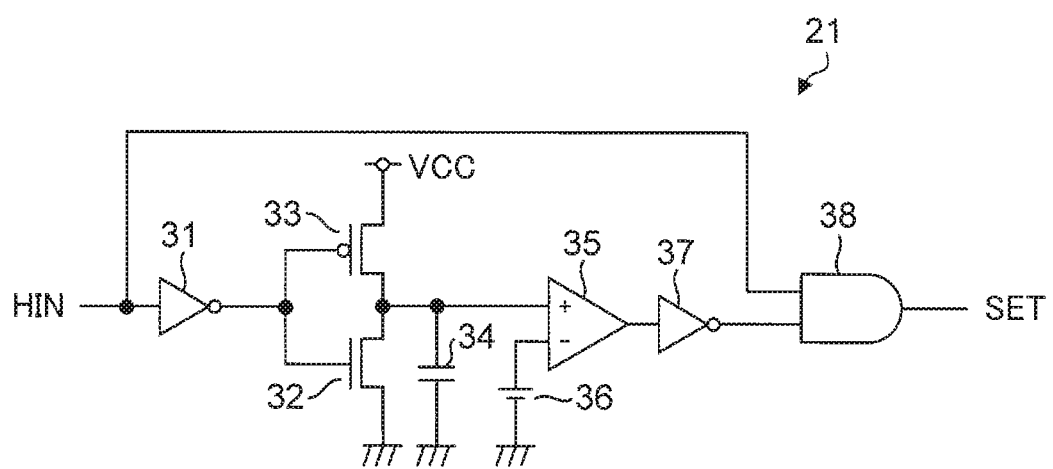
FIG. 3 is a circuit diagram illustrative of an example of a rising edge trigger circuit.
Figure 4:
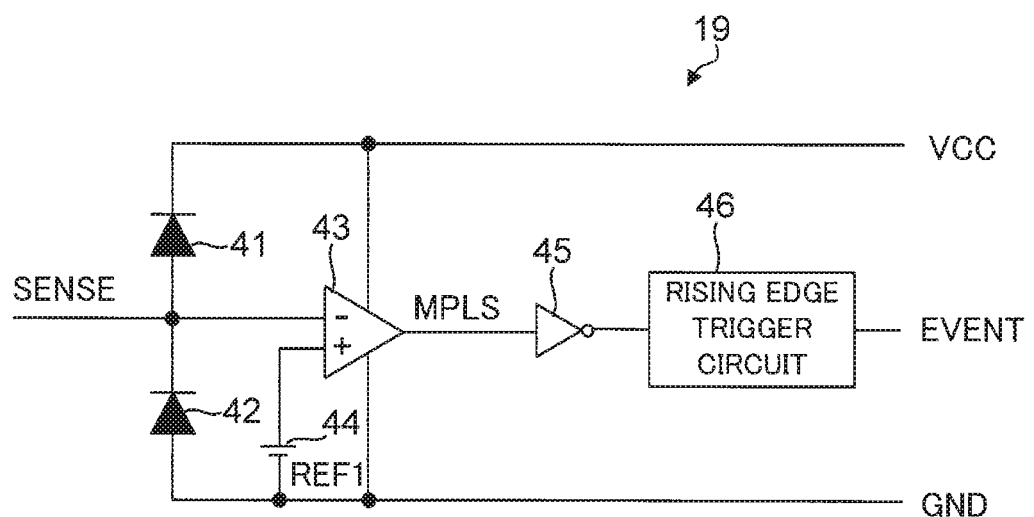
FIG. 4 is a circuit diagram illustrative of an example of a high-side potential determination circuit.
Figure 5:
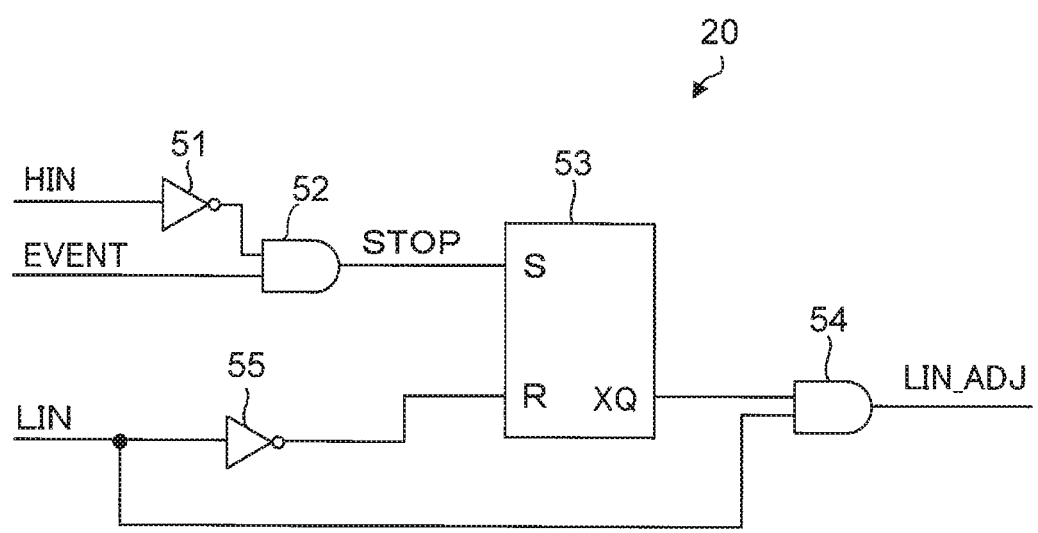
FIG. 5 is a circuit diagram illustrative of an example of an on-pulse stop circuit included in the totem-pole circuit driver according to the first embodiment.
Figure 6:
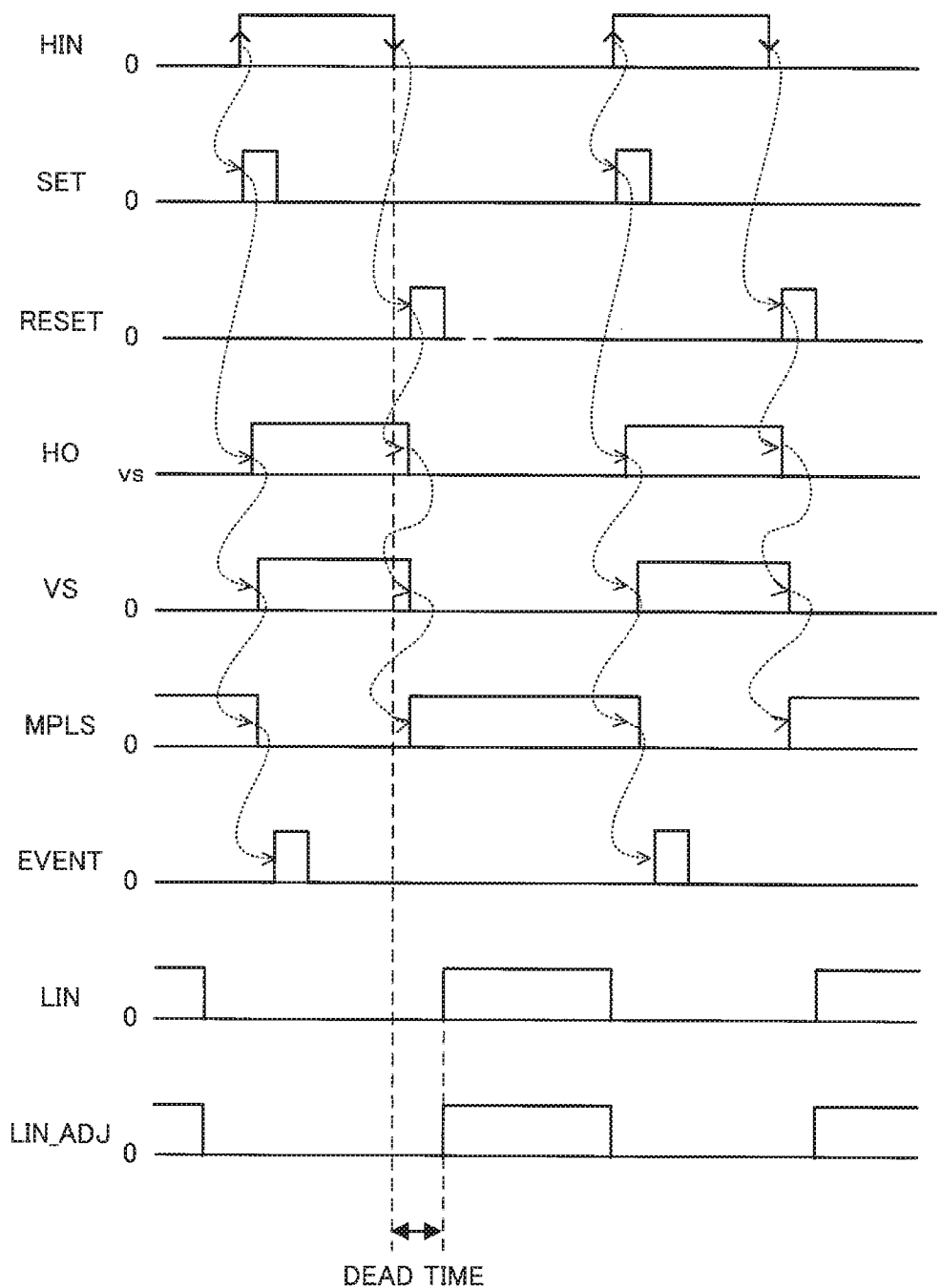
FIG. 6 is a timing chart illustrative of the normal operation of the totem-pole circuit driver.
Figure 7:
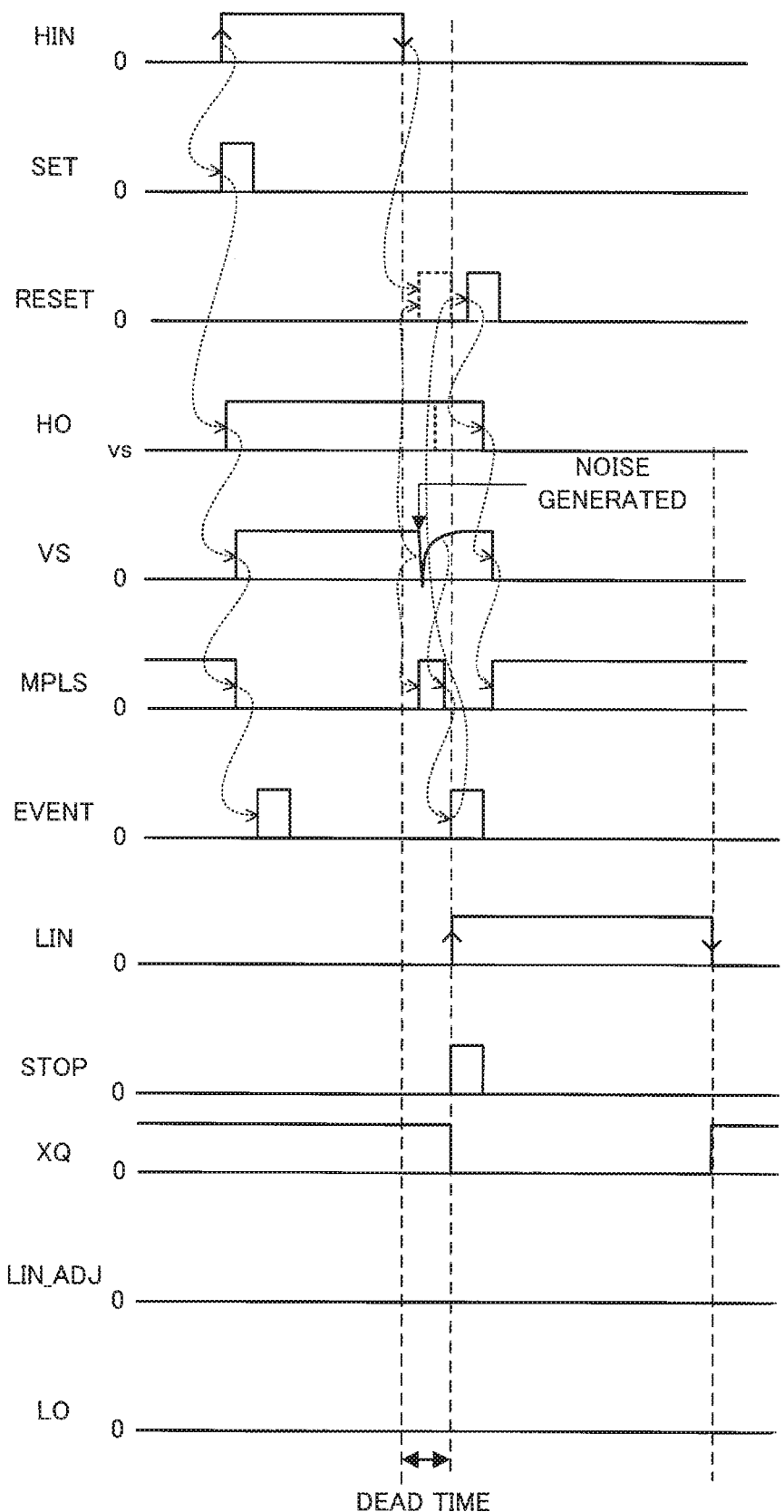
FIG. 7 is a timing chart illustrative of the operation at transmission failure time of the totem-pole circuit driver according to the first embodiment.

FIG. 1 is a circuit diagram illustrative of a switching power supply apparatus to which a totem-pole circuit driver according to a first embodiment is applied. FIG. 2 is a circuit diagram illustrative of an example of a pulse generation circuit. FIG. 3 is a circuit diagram illustrative of an example of a rising edge trigger circuit. FIG. 4 is a circuit diagram illustrative of an example of a high-side potential determination circuit. FIG. 5 is a circuit diagram illustrative of an example of an on-pulse stop circuit included in the totem-pole circuit driver according to the first embodiment. FIG. 6 is a timing chart illustrative of the normal operation of the totem-pole circuit driver. FIG. 7 is a timing chart illustrative of the operation at transmission failure time of the totem-pole circuit driver according to the first embodiment.

As illustrated in FIG. 1, the switching power supply apparatus has a totem-pole circuit including a high-side power device HQ and a low-side power device LQ cascade-connected and a totem-pole circuit driver (HVIC) 1. In this embodiment, the high-side power device HQ and the low-side power device LQ are n-channel power MOS transistors. However, the high-side power device HQ and the low-side power device LQ may be other power devices such as insulated gate bipolar transistors (IGBTs). Each of the high-side power device HQ and the low-side power device LQ and a body diode are connected in inverse parallel.

A drain of the high-side power device HQ is connected to a positive electrode terminal of a high-voltage power source 10 having a voltage HV. A source of the low-side power device LQ is connected to a negative electrode terminal of the high-voltage power source 10 and ground GND. The source of the low-side power device LQ is connected directly to the ground GND. However, the source of the low-side power device LQ may be connected to the ground GND via a resistor. The connection point of a source of the high-side power device HQ and a drain of the low-side power device LQ, that is to say, an output terminal of the totem-pole circuit is connected to one terminal of a load 11. The other terminal of the load 11 is connected to the ground GND.

The totem-pole circuit is connected to the totem-pole circuit driver 1 including a high-side drive circuit 12 and a low-side drive circuit 13. That is to say, a gate of the high-side power device HQ is connected to an output terminal HO of the high-side drive circuit 12 and a gate of the low-side power device LQ is connected to an output terminal LO of the low-side drive circuit 13. A reference potential terminal of the high-side drive circuit 12 is connected to the output terminal of the totem-pole circuit and a negative electrode terminal of a high-side power source 14 and a power source terminal of the high-side drive circuit 12 is connected to a positive electrode terminal of the high-side power source 14. A reference potential terminal of the low-side drive circuit 13 is connected to the ground GND and a negative electrode terminal of a low-side power source 15 and a power source terminal of the low-side drive circuit 13 is connected to a positive electrode terminal of the low-side power source 15. A low-side power source potential is indicated by VCC with the ground GND as reference. A high-side reference potential and a high-side power source potential are indicated by VS and VB, respectively, with the ground GND as reference.

The totem-pole circuit driver 1 further includes a pulse generation circuit 16, a level shift circuit 17, a high-side potential detection circuit 18, a high-side potential determination circuit 19, and an on-pulse stop circuit 20.

The pulse generation circuit 16 receives from an upper apparatus (not illustrated) an input logic signal HIN for controlling the high side, receives an event signal EVENT outputted by the high-side potential determination circuit 19, and generates a high-side set signal SET (pulse signal) and a high-side reset signal RESET (pulse signal). Furthermore, a power source terminal of the pulse generation circuit 16 is connected to the positive electrode terminal of the low-side power source and a reference potential terminal of the pulse generation circuit 16 is connected to the ground GND and the negative electrode terminal of the low-side power source 15.

The level shift circuit 17 includes high breakdown voltage MOS transistors HVN1 and HVN2, resistors LSR1 and LSR2, and clamp diodes D1 and D2. A gate of the MOS transistor HVN1 is connected to a set signal output terminal of the pulse generation circuit 16 from which the set signal SET is outputted. A gate of the MOS transistor HVN2 is connected to a reset signal output terminal of the pulse generation circuit 16 from which the reset signal RESET is outputted. A drain of the MOS transistor HVN1 is connected to one terminal of the resistor LSR1 and the other terminal of the resistor LSR1 is connected to the power source terminal of the high-side drive circuit 12. A drain of the MOS transistor HVN2 is connected to one terminal of the resistor LSR2 and the other terminal of the resistor LSR2 is connected to the power source terminal of the high-side drive circuit 12. The connection point of the drain of the MOS transistor HVN1 and the resistor LSR1 is connected to an input terminal of the high-side drive circuit 12 and a cathode of the diode D1. The connection point of the drain of the MOS transistor HVN2 and the resistor LSR2 is connected to an input terminal of the high-side drive circuit 12 and a cathode of the diode D2. Anodes of the diodes D1 and D2 are connected to the output terminal of the totem-pole circuit. Sources of the MOS transistors HVN1 and HVN2 are connected to the ground GND.

The high-side potential detection circuit 18 detects the high-side reference potential VS. In this embodiment a resistant field plate (RFP) is used as a detection means. The resistant field plate is formed for the purpose of relaxing an electric field at a voltage withstand region high voltage junction terminal (HVJT) in a high withstand voltage region device of a high-side circuit (see, for example, International Publication No. WO2013/069408). With the high-side potential detection circuit 18 a branch point is provided in the resistant field plate to divide it into two resistors RFP1 and RFP2. One terminal of the resistant field plate is connected to the output terminal of the totem-pole circuit (high-side reference potential VS) and the other terminal of the resistant field plate is connected to the ground GND. The branch point of the resistant field plate is connected to an input terminal of the high-side potential determination circuit 19 and outputs a detection signal SENSE indicative of a change in the high-side reference potential VS.

The high-side potential determination circuit 19 receives the detection signal SENSE outputted by the high-side potential detection circuit 18 and outputs an event signal EVENT for detecting an unexpected change in the high-side reference potential VS caused by the influence of external noise. A power source terminal of the high-side potential determination circuit 19 is connected to the positive electrode terminal of the low-side power source 15 and a reference potential terminal of the high-side potential determination circuit 19 is connected to the ground GND and the negative electrode terminal of the low-side power source 15.

The event signal EVENT outputted by the high-side potential determination circuit 19, the input logic signal HIN for controlling the high side, and an input logic signal LIN for controlling the low side are inputted to the on-pulse stop circuit 20. Furthermore, the on-pulse stop circuit 20 outputs a signal LIN_ADJ for controlling the low side obtained by validating or invalidating the input logic signal LIN for controlling the low side according to the logic states of the event signal EVENT and the input logic signal HIN for controlling the high side. The signal LIN_ADJ is inputted to the low-side drive circuit 13.

Concrete examples of the pulse generation circuit 16, the high-side potential determination circuit 19, and the on-pulse stop circuit 20 and a concrete example of a rising edge trigger circuit used in the pulse generation circuit 16 and the high-side potential determination circuit 19 will now be described.

As illustrated in FIG. 2, the pulse generation circuit 16 has a HIN terminal and an EVENT terminal as input terminals and has a SET terminal and a RESET terminal as output terminals. The HIN terminal is connected to an input of a rising edge trigger circuit 21. An output of the rising edge trigger circuit 21 is connected to the SET terminal. Furthermore, the HIN terminal is connected to an input of an inverter 22. An output of the inverter 22 is connected to an input of a rising edge trigger circuit 23 and an output of the rising edge trigger circuit 23 is connected to one input of an OR circuit 24. An output of the OR circuit 24 is connected to the RESET terminal. Furthermore, the output of the inverter 22 is connected to one input of an AND circuit 25. The other input of the AND circuit 25 is connected to the EVENT terminal. An output of the AND circuit 25 is connected to the other input of the OR circuit 24.

The pulse generation circuit 16 includes the rising edge trigger circuits 21 and 23 which are equal in structure. Therefore, an example of the circuit structure of the rising edge trigger circuit 21 will now be described as a representative of them.

As illustrated in FIG. 3, the rising edge trigger circuit 21 has a HIN terminal from which an input logic signal HIN for controlling the high side is inputted. The HIN terminal is connected to an input of an inverter 31. An output of the inverter 31 is connected to gates of an nMOS transistor 32 and a pMOS transistor 33. A source of the nMOS transistor 32 is connected to the ground GND and a drain of the nMOS transistor 32 is connected to a drain of the pMOS transistor 33. A source of the pMOS transistor 33 is connected to the positive electrode terminal of the low-side power source 15 from which the low-side power source potential VCC is supplied. An output of a CMOS inverter circuit made up of the nMOS transistor 32 and the pMOS transistor 33 is connected to one end of a capacitor 34. The other end of the capacitor 34 is connected to the ground GND. Furthermore, the output of the CMOS inverter circuit is connected to a non-inverting input of a comparator 35. A positive electrode terminal of a reference voltage source 36 is connected to an inverting input of the comparator 35. A negative electrode terminal of the reference voltage source 36 is connected to the ground GND. An output of the comparator 35 is connected to an input of an inverter 37. An output of the inverter 37 is connected to one input of an AND circuit 38. The other input of the AND circuit 38 is connected to the HIN terminal. An output of the AND circuit 38 is connected to the SET terminal.

The rising edge trigger circuit 21 has been described. The rising edge trigger circuit 23 which generates a reset signal RESET has the same structure and the same circuit element constants. As stated above, the rising edge trigger circuits 21 and 23 are equal in structure. Accordingly, the operation of the rising edge trigger circuit 23 will be described by reference to FIG. 3.

As illustrated in FIG. 4, the high-side potential determination circuit 19 has a SENSE terminal from which a detection signal SENSE outputted by the high-side potential detection circuit 18 is inputted. The SENSE terminal is connected to an anode of a protection diode 41, a cathode of a protection diode 42, and an inverting input of a comparator 43. A cathode of the protection diode 41 is connected to a VCC terminal. The VCC terminal is the positive electrode terminal of the low-side power source 15 from which the low-side power source potential VCC is supplied. An anode of the protection diode 42 is connected to a GND terminal. A non-inverting input of the comparator 43 is connected to a positive electrode terminal of a reference voltage source 44 from which a reference voltage REF1 is outputted, and a negative electrode terminal of the reference voltage source 44 is connected to the GND terminal. An output of the comparator 43 is connected to an input of an inverter 45. An output of the inverter 45 is connected to an input of a rising edge trigger circuit 46 and an output of the rising edge trigger circuit 46 is connected to an EVENT terminal. Furthermore, a power source terminal of the comparator 43 is connected to the VCC terminal and a ground terminal of the comparator 43 is connected to the GND terminal. The comparator 43 compares the detection signal SENSE with the reference voltage REF1. Actually, the reference voltage source 44 has two different reference voltages and the comparator 43 is a hysteresis comparator. Furthermore, the rising edge trigger circuit 46 is equal in circuit structure to the rising edge trigger circuit 21 illustrated in FIG. 3. Therefore, the operation of the following rising edge trigger circuit 46 will be described by reference to FIG. 3.

As illustrated in FIG. 5, the on-pulse stop circuit 20 has a HIN terminal, an EVENT terminal and a LIN terminal as input terminals and has a LIN_ADJ terminal as an output terminal. The HIN terminal is connected to an input of an inverter 51 and an output of the inverter 51 is connected to one input of an AND circuit 52. The other input of the AND circuit 52 is connected to the EVENT terminal. An output of the AND circuit 52 is connected to a set input of an RS (Reset-Set) flip-flop circuit 53. The LIN terminal is connected to an input of an inverter 55 and an output of the inverter 55 is connected to a reset input of the RS flip-flop circuit 53. An inverting output (XQ) of the RS flip-flop circuit 53 is connected to one input of an AND circuit 54. The other input of the AND circuit 54 is connected to the LIN terminal. An output of the AND circuit 54 is connected to the LIN_ADJ terminal. The RS flip-flop circuit 53 is a set dominant flip-flop circuit.

The on-pulse stop circuit 20 operates in the following way. When a low(L)-level input logic signal HIN for controlling the high side and a high(H)-level event signal EVENT are inputted, a stop signal STOP sets the RS flip-flop circuit 53. At this time an L-level signal is outputted from the inverting output of the RS flip-flop circuit 53. Therefore, the AND circuit 54 prevents an H-level input logic signal LIN for controlling the low side inputted from the LIN terminal from being transmitted. As a result, even when an H-level input logic signal LIN for controlling the low side is inputted from the LIN terminal, an H-level signal LIN_ADJ is not outputted to the LIN_ADJ terminal. Furthermore, the RS flip-flop circuit 53 is a set dominant flip-flop circuit. Accordingly, as long as the stop signal STOP is at an H level, the RS flip-flop circuit 53 is not reset even when an H-level reset signal is inputted to the reset input. As a result, a logic state at the inverting output does not change.

The operation of the switching power supply apparatus having the above structure will now be described by reference to the timing charts of FIGS. 6 and 7.

First, as illustrated in FIG. 6, at normal operation time the pulse generation circuit 16 outputs a set signal SET at the timing of the rising edge of an input logic signal HIN and outputs a reset signal RESET at the timing of the falling edge of the input logic signal HIN.

That is to say, when an H-level input logic signal HIN is inputted, the H-level input logic signal HIN is applied to the other input of the AND circuit 38 of the rising edge trigger circuit 21. Just after the H-level input logic signal HIN is applied, an H-level signal is applied to the one input of the AND circuit 38. Therefore, the AND circuit 38 outputs a set signal SET which becomes an H level at the timing of the rising edge of the input logic signal HIN.

Furthermore, the H-level input logic signal HIN is inputted to the inverter 31 and is inverted to an L-level signal. The nMOS transistor 32 is turned off by the L-level signal and the pMOS transistor 33 is turned on by the L-level signal. As a result, the capacitor 34 is charged. When a charging voltage of the capacitor 34 exceeds the potential of the reference voltage source 36, the comparator 35 outputs an H-level signal. The H-level signal is inverted by the inverter 37 to an L-level signal. Accordingly, the AND circuit 38 outputs an L-level set signal SET.

On the other hand, when an L-level input logic signal HIN is inputted, the L-level input logic signal HIN is applied to the other input of the AND circuit 38 of the rising edge trigger circuit 21. As a result, an output of the AND circuit 38 becomes an L level. At this time, the L-level input logic signal HIN is inputted to the inverter and is inverted to an H-level signal. The nMOS transistor 32 is turned on by the H-level signal and the pMOS transistor 33 is turned off by the H-level signal. As a result, the capacitor 34 is discharged. When a discharging voltage of the capacitor 34 falls below the potential of the reference voltage source 36, the comparator 35 outputs an L-level signal. The L-level signal is inverted by the inverter 37 to an H-level signal. The H-level signal is applied to the one input of the AND circuit 38. However, the other input of the AND circuit 38 is at the L level. As a result, an output of the AND circuit 38 remains at the L level.

Accordingly, when an input logic signal HIN is inputted, the rising edge trigger circuit 21 outputs a set signal SET having a determined on-width which becomes an H level at the timing of the rising edge of the input logic signal HIN. When the set signal SET is transmitted via the level shift circuit 17 to the high-side drive circuit 12, the high-side drive circuit 12 outputs to the output terminal HO a signal by which the high-side power device HQ is turned on. When the high-side power device HQ is turned on, a high-side reference potential VS rises and is detected by the high-side potential detection circuit 18. A detection signal SENSE outputted by the high-side potential detection circuit 18 is inputted to the high-side potential determination circuit 19. When the detection signal SENSE proportional to the high-side reference potential VS and having a large value is inputted, the comparator 43 of the high-side potential determination circuit 19 outputs an L-level determination signal MPLS. The L-level determination signal MPLS is inverted by the inverter 45 to an H-level signal. The H-level signal is inputted to the rising edge trigger circuit 46. The rising edge trigger circuit 46 outputs an event signal EVENT having a determined on-width which rises at the timing of the falling edge of the determination signal MPLS. The H-level event signal EVENT is inputted to the on-pulse stop circuit 20.

When the H-level event signal EVENT and the H-level input logic signal HIN are inputted, the AND circuit 52 of the on-pulse stop circuit 20 outputs an L-level stop signal STOP. At this time an input logic signal LIN at the LIN terminal is already at an L level. Therefore, the RS flip-flop circuit 53 has been reset and the inverting output is at an H level. However, the L-level input logic signal LIN is inputted to the AND circuit 54. Therefore, a signal LIN_ADJ remains at an L level.

Next, when the input logic signal HIN becomes an L level, the pulse generation circuit 16 outputs a reset signal RESET at the timing of the falling edge of the input logic signal HIN. This reset signal RESET is transmitted via the level shift circuit 17 to the high-side drive circuit 12. Accordingly, the high-side drive circuit 12 outputs to the output terminal HO a signal by which the high-side power device HQ is turned off. As a result, the high-side reference potential VS falls. At this time the high-side potential determination circuit 19 receives the detection signal SENSE whose value has become smaller. BY doing so, the comparator 43 outputs an H-level determination signal MPLS. Only an L-level signal obtained by inverting the determination signal MPLS by the inverter 45 is inputted to the rising edge trigger circuit 46 at the timing of the rising edge of the determination signal MPLS. Therefore, the event signal EVENT remains at an L level.

An H-level input logic signal LIN is inputted to the LIN terminal a dead time after the input logic signal HIN becomes the L level. At this time, in the on-pulse stop circuit 20, the event signal EVENT remains at the L level and the stop signal STOP is at the L level. However, before the input logic signal LIN becomes the H level, that is to say, when the input logic signal LIN was at an L level, the RS flip-flop circuit 53 is reset. Therefore, when the H-level input logic signal LIN is inputted to the LIN terminal, the AND circuit 54 outputs an H-level signal LIN_ADJ. That is to say, a signal LIN_ADJ whose level is the same as that of the input logic signal LIN is outputted to the LIN_ADJ terminal of the on-pulse stop circuit 20 at the same timing when the H-level input logic signal LIN is inputted.

The following case may arise. At the timing at which the pulse generation circuit 16 outputs a reset signal RESET, the high-side reference potential VS falls due to external noise. As a result, the reset signal RESET is not normally transmitted to the high-side drive circuit 12. This case will now be described by reference to FIG. 7.

If a reset signal RESET is not transmitted to the high-side drive circuit 12, a fall in the high-side reference potential VS caused by external noise is the cause and is detected by the high-side potential determination circuit 19. That is to say, when the comparator 43 of the high-side potential determination circuit 19 detects a fall in the high-side reference potential VS, the comparator 43 outputs an H-level determination signal MPLS. After that, the high-side reference potential VS recovers and a detection signal SENSE exceeds the reference voltage REF1. At this time the comparator 43 outputs an L-level determination signal MPLS. An H-level event signal EVENT is outputted at the timing of the falling edge of the determination signal MPLS.

When an L-level input logic signal HIN is inputted to the on-pulse stop circuit 20 and the H-level event signal EVENT is inputted to the on-pulse stop circuit 20, a stop signal STOP becomes an H level and the RS flip-flop circuit 53 goes into a set state. As a result, the inverting output of the RS flip-flop circuit 53 outputs an L-level signal. Accordingly, the AND circuit 54 invalidates an input logic signal LIN inputted to the LIN terminal. That is to say, even when an H-level input logic signal LIN is inputted in this state, an H-level signal LIN_ADJ is not outputted.

Furthermore, when the L-level input logic signal HIN is inputted to the pulse generation circuit 16 and an event signal EVENT is inputted to the pulse generation circuit 16, the OR circuit 24 regenerates a reset signal RESET. At this time the high-side reference potential VS has recovered. Accordingly, the reset signal RESET is normally transmitted to the high-side drive circuit 12. When the high-side drive circuit 12 receives the reset signal RESET, an output signal from the HO terminal changes to a signal by which the high-side power device HQ is turned off. As a result, the high-side reference potential VS falls and the determination signal MPLS obtained by detecting the high-side reference potential VS becomes an H level.

When the high-side power device HQ is turned off in this way by the reset signal RESET regenerated in a state in which an on-pulse on the low side is stopped, a current flowing through the load 11 is commutated to the body diode of the low-side power device LQ. There are some inductances including a parasitic inductance on the side of the load 11. Therefore, a load current does not become zero instantaneously. However, if the load 11 is not an inductive load, then a load current is consumed in a short period of time and becomes zero.

Furthermore, even if the high-side power device HQ is turned off, that is to say, the event signal EVENT is generated after the elapse of a dead time to the time when the low-side power device LQ is turned on, a through current does not flow. The signal LIN_ADJ is originally at an H level for a period from the time when the input logic signal LIN becomes an H level to the time when the event signal EVENT is generated. For this period, however, the determination signal MPLS is at an H level and the high-side reference potential VS falls rapidly due to external noise. A voltage is not applied in substance between the source and drain of the low-side power device LQ. Therefore, even if the low-side power device LQ is turned on in this state, a current hardly flows through the low-side power device LQ.

From the generation of the event signal EVENT on, as stated above, transmission of the input logic signal LIN by which the low-side power device LQ is turned on to the low-side drive circuit 13 is stopped. Therefore, the low-side power device LQ is not turned on.

Furthermore, after the level shift circuit 17 normally transmits a set signal SET and the reset signal RESET, the high-side reference potential VS falls to a ground level. At this time, however, high external noise may be superimposed on the high-side reference potential VS. At this time the high-side potential determination circuit 19 outputs an H-level event signal EVENT. The pulse generation circuit 16 which receives this event signal EVENT outputs a reset signal RESET. At this time, however, the high-side drive circuit 12 is in a reset state. Therefore, there is no change in the operation. In the on-pulse stop circuit 20 which receives this event signal EVENT, on the other hand, the RS flip-flop circuit 53 goes into a set state by the stop signal STOP. Therefore, its inverting output becomes an L level. As a result, the signal LIN_ADJ becomes an L level. From this timing on, an on-pulse on the low side in this cycle is stopped.

Second Embodiment

Figure 8:
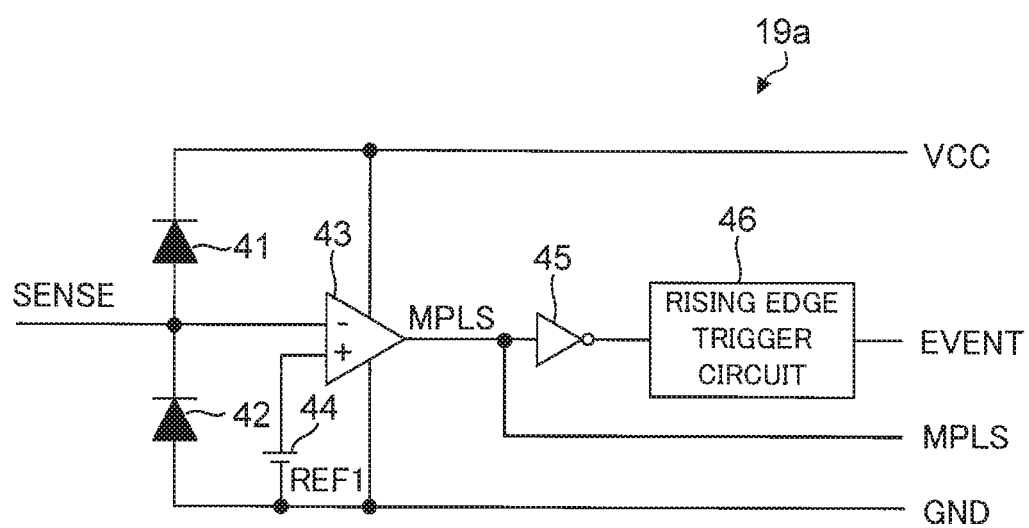
FIG. 8 is a circuit diagram illustrative of an example of a high-side potential determination circuit in a second embodiment.
Figure 9:
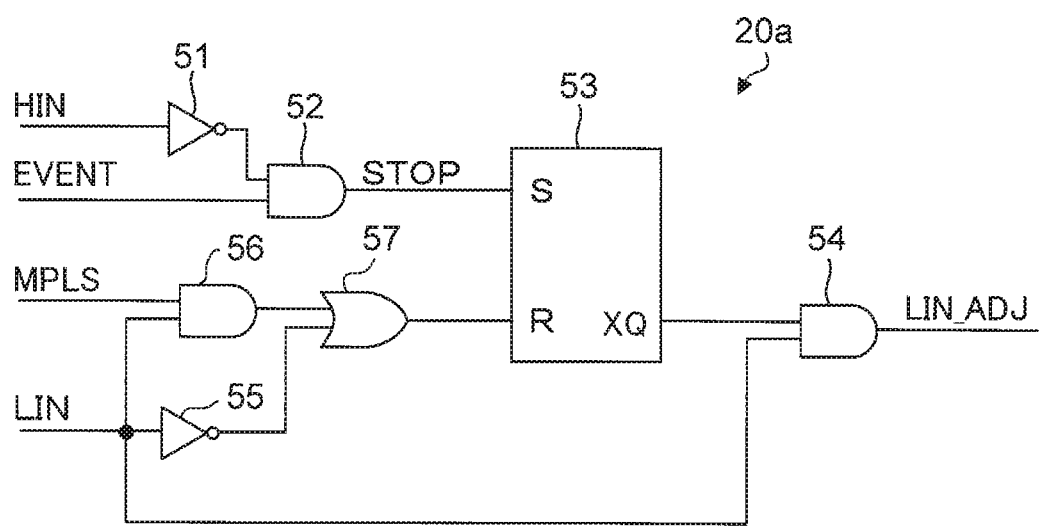
FIG. 9 is a circuit diagram illustrative of an example of an on-pulse stop circuit in the second embodiment.
Figure 10:
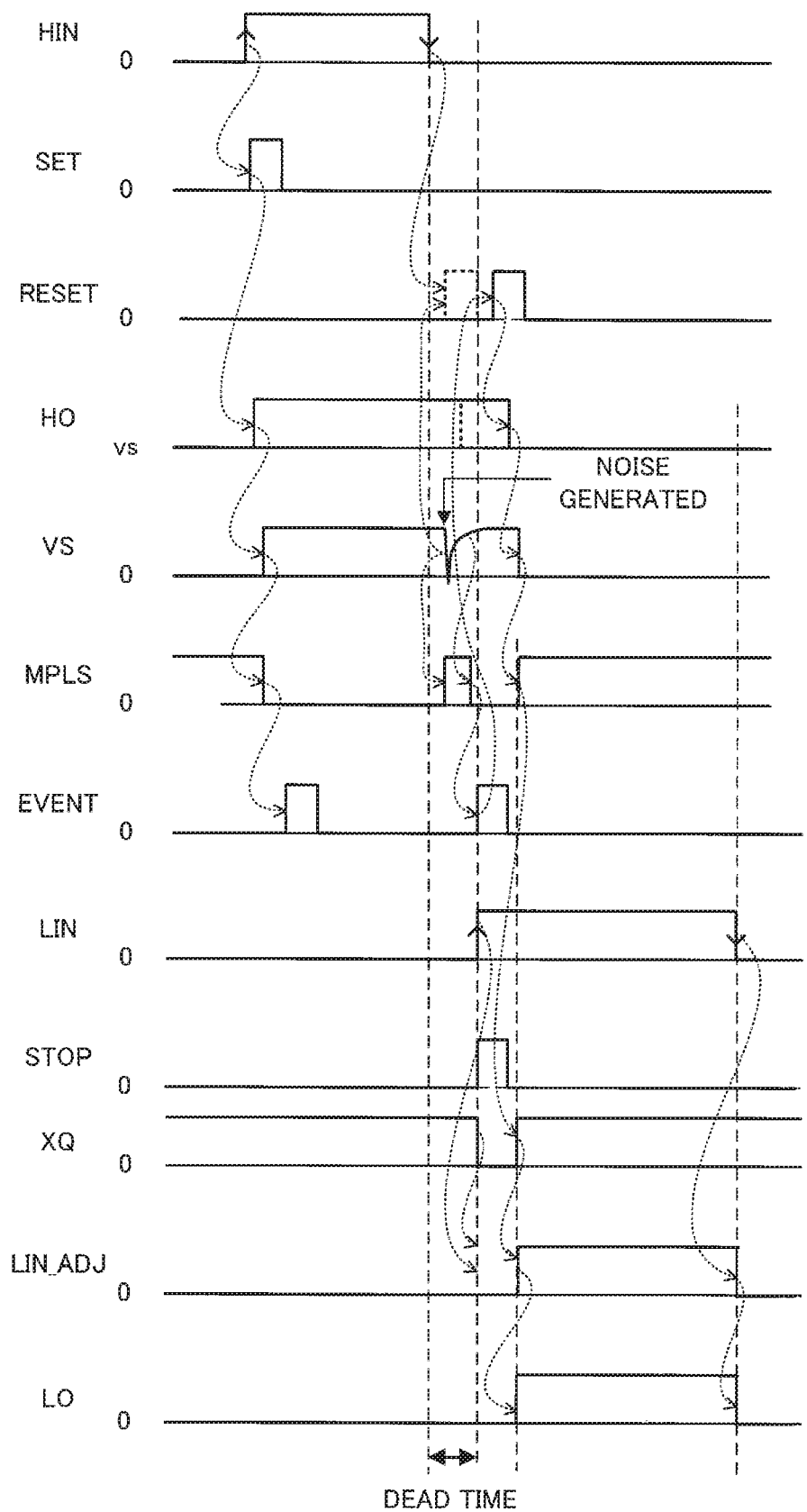
FIG. 10 is a timing chart illustrative of the operation at transmission failure time of a totem-pole circuit driver according to the second embodiment.

FIG. 8 is a circuit diagram illustrative of an example of a high-side potential determination circuit in a second embodiment. FIG. 9 is a circuit diagram illustrative of an example of an on-pulse stop circuit in the second embodiment. FIG. 10 is a timing chart illustrative of the operation at transmission failure time of a totem-pole circuit driver according to the second embodiment. Components in FIGS. 8 and 9 which are the same as or equivalent to those illustrated in FIGS. 4 and 5 are marked with the same symbols and detailed descriptions of them will be omitted. Furthermore, because units included in a totem-pole circuit driver according to the second embodiment are the same as those included in the totem-pole circuit driver according to the first embodiment except the high-side potential determination circuit 19 and the on-pulse stop circuit 20, detailed descriptions of them will be omitted.

As illustrated in FIG. 8, a high-side potential determination circuit 19a in the second embodiment differs from the high-side potential determination circuit 19 included in the totem-pole circuit driver according to the first embodiment only in that it has an MPLS terminal. The high-side potential determination circuit 19a is the same as the high-side potential determination circuit 19 in the other respects. The MPLS terminal is connected to an output of a comparator 43.

As illustrated in FIG. 9, an on-pulse stop circuit 20a in the second embodiment is obtained by adding an MPLS terminal, an AND circuit 56, and an OR circuit 57 to the on-pulse stop circuit 20 included in the totem-pole circuit driver according to the first embodiment. That is to say, the MPLS terminal is connected to one input of the AND circuit 56 and the other input of the AND circuit 56 is connected to a LIN terminal. Furthermore, an output of the AND circuit 56 is connected to one input of the OR circuit 57. The other input of the OR circuit 57 is connected to an output of an inverter 55 and an output of the OR circuit 57 is connected to a reset input of an RS flip-flop circuit 53.

With the on-pulse stop circuit 20a, first, the RS flip-flop circuit 53 is reset when an input logic signal LIN changes to an L level. This is the same with the first embodiment. With the on-pulse stop circuit 20a, secondly, the RS flip-flop circuit 53 is reset when the input logic signal LIN is at an H level, a high-side power device HQ is turned off by a regenerated reset signal RESET, and a determination signal MPLS becomes an H level. As a result, the H-level input logic signal LIN becomes valid at the timing at which the RS flip-flop circuit 53 is reset, and is outputted from a LIN_ADJ terminal. That is to say, with the on-pulse stop circuit 20a the high-side power device HQ is turned off by the regenerated reset signal RESET. An on-pulse on the low side in that cycle is validated at that timing. With the on-pulse stop circuit 20, on the other hand, an on-pulse on the low side in that cycle is invalidated.

With a totem-pole circuit driver 1 having the above structure, the same operation that is illustrated in FIG. 6 is performed at normal operation time. Accordingly, description of the operation of the totem-pole circuit driver 1 according to the second embodiment performed at normal operation time will be omitted.

The following case may arise. At the timing at which a pulse generation circuit 16 outputs a reset signal RESET, a high-side reference potential VS falls due to external noise. As a result, the reset signal RESET is not normally transmitted to a high-side drive circuit 12. This case will now be described. In this case, as illustrated in FIG. 10, a fall in the high-side reference potential VS caused by the external noise and its recovery are detected and an event signal EVENT and a reset signal RESET are outputted. An HO terminal becomes an L level and a determination signal MPLS becomes an H level. The operation performed until this time is the same as that illustrated in FIG. 7. At this time the RS flip-flop circuit 53 is in a set state. An AND circuit 54 invalidates an input logic signal LIN inputted to a LIN terminal.

When an H-level determination signal MPLS is inputted to the on-pulse stop circuit 20a, the RS flip-flop circuit 53 goes into a reset state because an H-level input logic signal LIN is inputted to the LIN terminal. As a result, an inverting output of the RS flip-flop circuit 53 becomes an H level. Therefore, the AND circuit 54 validates the input logic signal LIN inputted to the LIN terminal. A low-side drive circuit 13 outputs an H-level signal to an LO terminal at the timing at which it receives an H-level signal LIN_ADJ, and turns on a low-side power device LQ.

When the high-side power device HQ is turned off in this way by a reset signal RESET regenerated in a state in which an on-pulse on the low side is kept invalid, a current flowing through a load 11 is commutated to a body diode of the low-side power device LQ. Just after the high-side power device HQ is turned off, the low-side power device LQ is turned on. Therefore, at this time the current commutated to the body diode of the low-side power device LQ flows through the low-side power device LQ.

Usually the forward voltage of the body diode is higher than the source-drain voltage which is generated when the low-side power device LQ is turned on. Accordingly, if a load current is commutated to the low side when the low-side power device LQ is in an off state, loss is great compared with when the low-side power device LQ is in an on state.

Accordingly, with the on-pulse stop circuit 20a, if resetting the high-side power device HQ again becomes valid, the low-side power device LQ is turned on even after the low-side power device LQ is turned off. This reduces the loss.

Furthermore, even if the high-side power device HQ is turned off after the elapse of a dead time to the time when the low-side power device LQ is turned on, a through current does not flow. This is the same with the above first embodiment. The operation performed before the generation of the event signal EVENT is the same with the above first embodiment. After the generation of the event signal EVENT, the low-side power device LQ is in an off state only for a short period of time until the determination signal MPLS becomes an H level.

Moreover, after a level shift circuit 17 normally transmits a set signal SET and the reset signal RESET, the high-side power device HQ may be turned on erroneously due to high external noise. At this time the low-side power device LQ has already been turned on. Therefore, the high-side reference potential VS rises to a voltage obtained by dividing a voltage HV of a high-voltage power source 10 by the on-state resistances of the high-side power device HQ and the low-side power device LQ. As a result, the high-side potential determination circuit 19a generates a determination signal MPLS and an event signal EVENT. This is the same with a case where the low-side power device LQ is in an off state.

In the above embodiment the high-side potential determination circuit 19 detects a change in the high-side reference potential VS. However, the high-side potential determination circuit 19 may detect the high-side power source potential VB which is always higher than the high-side reference potential VS by the voltage of the high-side power source 14.

With the totem-pole circuit driver having the above structure, when there is a need to exercise on-control of a low-side power device and a high-side power device is in an on state, a low-side input logic signal is invalidated. This prevents a through current from flowing and therefore prevents an unintentional stoppage of the operation.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A totem-pole circuit driver for driving a totem-pole circuit including a high-side power device and a low-side power device which are cascade-connected, the totem-pole circuit driver comprising:
    a high-side drive circuit which drives the high-side power device;
    a low-side drive circuit which drives the low-side power device;
    a pulse generation circuit which receives a high-side input logic signal that has a first edge and a second edge, and generates a set signal for turning on the high-side power device and a reset signal for turning off the high-side power device, based respectively on the first edge and the second edge;
    a level shift circuit which transmits the set signal and the reset signal to the high-side drive circuit;
    a high-side potential detection circuit which detects a high-side reference potential;
    a high-side potential determination circuit which
        compares a value of the high-side reference potential detected by the high-side potential detection circuit with a reference voltage, and
        outputs an event signal upon detecting that the value of the high-side reference potential exceeds the reference voltage; and
    an on-pulse stop circuit which receives a low-side input logic signal, and validates or invalidates the low-side input logic signal based on the high-side input logic signal and the event signal, wherein
    when the high-side input logic signal is at a low level, by which the high-side power device is turned off, and upon receiving the event signal,
        the pulse generation circuit regenerates the reset signal, and
        the on-pulse stop circuit invalidates the low-side input logic signal and outputs a signal at a low level, by which the low-side power device is turned off.

2. The totem-pole circuit driver according to claim 1, wherein the on-pulse stop circuit includes:
    a first inverter which inverts the high-side input logic signal;
    a first AND circuit which performs an AND operation on an output of the first inverter and the event signal;
    a second inverter which inverts the low-side input logic signal;
    a Reset-Set (RS) flip-flop having a set terminal, a reset terminal and an inverting output terminal, the RS flip-flop receiving an output of the first AND circuit at the set terminal and receiving an output of the second inverter at the reset terminal; and
    a second AND circuit which
        performs an AND operation on an output of the inverting output terminal of the RS flip-flop, and the low-side input logic signal, and
        outputs a signal to the low-side drive circuit.

3. The totem-pole circuit driver according to claim 1, wherein
    upon detecting that the value of the high-side reference potential becomes lower than the reference voltage, the high-side potential determination circuit outputs a determination signal, and
    upon receiving the determination signal and upon detecting that the low-side input logic signal is at a high level, the on-pulse stop circuit validates the low-side input logic signal.

4. The totem-pole circuit driver according to claim 3, wherein the on-pulse stop circuit includes:
    a first inverter which inverts the high-side input logic signal;
    a first AND circuit which performs an AND operation on an output of the first inverter and the event signal;
    a second inverter which inverts the low-side input logic signal;
    a second AND circuit which performs an AND operation on the determination signal and the low-side input logic signal;
    an OR circuit which receives an output of the second inverter and an output of the second AND circuit;
    a Reset-Set (RS) flip-flop having a set terminal, a reset terminal and an inverting output terminal, the RS flip-flop receiving an output of the first AND circuit at the set terminal and receiving an output of the OR circuit at the reset terminal; and
    a third AND circuit which
        performs an AND operation on an output of the inverting output terminal of the RS flip-flop and the low-side input logic signal, and
        outputs a signal to the low-side drive circuit.

\* \* \* \* \*